United States Patent [19]
Balch et al.

[11] Patent Number: 5,279,706
[45] Date of Patent: Jan. 18, 1994

[54] METHOD AND APPARATUS FOR FABRICATING A METAL INTERCONNECTION PATTERN FOR AN INTEGRATED CIRCUIT MODULE

[75] Inventors: Ernest W. Balch, Ballston Spa; Stanton E. Weaver, Jr., Northville; William H. King, Schenectady; Bernard Gorowitz, Clifton Park, all of N.Y.

[73] Assignee: General Electric Company, Schenectady, N.Y.

[21] Appl. No.: 959,883

[22] Filed: Oct. 13, 1992

[51] Int. Cl.$^5$ ............................ B44C 1/22; C23F 1/00
[52] U.S. Cl. ................................. 156/659.1; 156/656; 156/902; 430/296; 430/318
[58] Field of Search ............ 156/633, 634, 656, 659.1, 156/345, 901, 902; 29/827, 842, 846, 874; 361/396, 385, 393, 405, 406, 412, 414; 357/65, 67, 68, 71; 437/180, 182, 209, 217, 220, 228; 430/296, 318

[56] References Cited

U.S. PATENT DOCUMENTS

| | | | |
|---|---|---|---|
| 4,783,695 | 11/1988 | Eichelberger et al. | 357/65 |
| 4,835,704 | 5/1989 | Eichelberger et al. | 364/490 |
| 4,918,811 | 4/1990 | Eichelberger et al. | 29/840 |
| 4,937,203 | 6/1990 | Eichelberger et al. | 437/209 X |
| 5,019,946 | 5/1991 | Eichelberger et al. | 361/414 |

OTHER PUBLICATIONS

Research Devices (American Optical Corp.) literature.
"Electrodeposition of Primary Photoresists", Electronic Packaging & Production, Feb. 1992, pp. 66-68.
"Powder Coatings Applied by Electrostatic Spray", S. T. Harris, The Technology of Powder Coatings, Aug. 1976, Chapter 10, pp. 171-206.
"Introduction to Photomasking", Peter Van Zant, Microchip Fabrication, 1984, Chapter 9, pp. 87-100.
"Imaging", David Elliott, Microlithography, 1986, Chapter 4, pp. 101-227.

Primary Examiner—William A. Powell
Attorney, Agent, or Firm—Geoffrey H. Krauss; Howard A. Skaist

[57] ABSTRACT

A method for fabricating a metal interconnection pattern for an integrated circuit module is provided comprising the steps of: aligning only one face of the module, forming a metal layer on at least one other face of the module, applying a coating of photoresist to the metal layer, exposing predetermined portions of the photoresist to reflected radiation, and shaping the metal layer in accordance with the exposed photoresist portions.

19 Claims, 10 Drawing Sheets

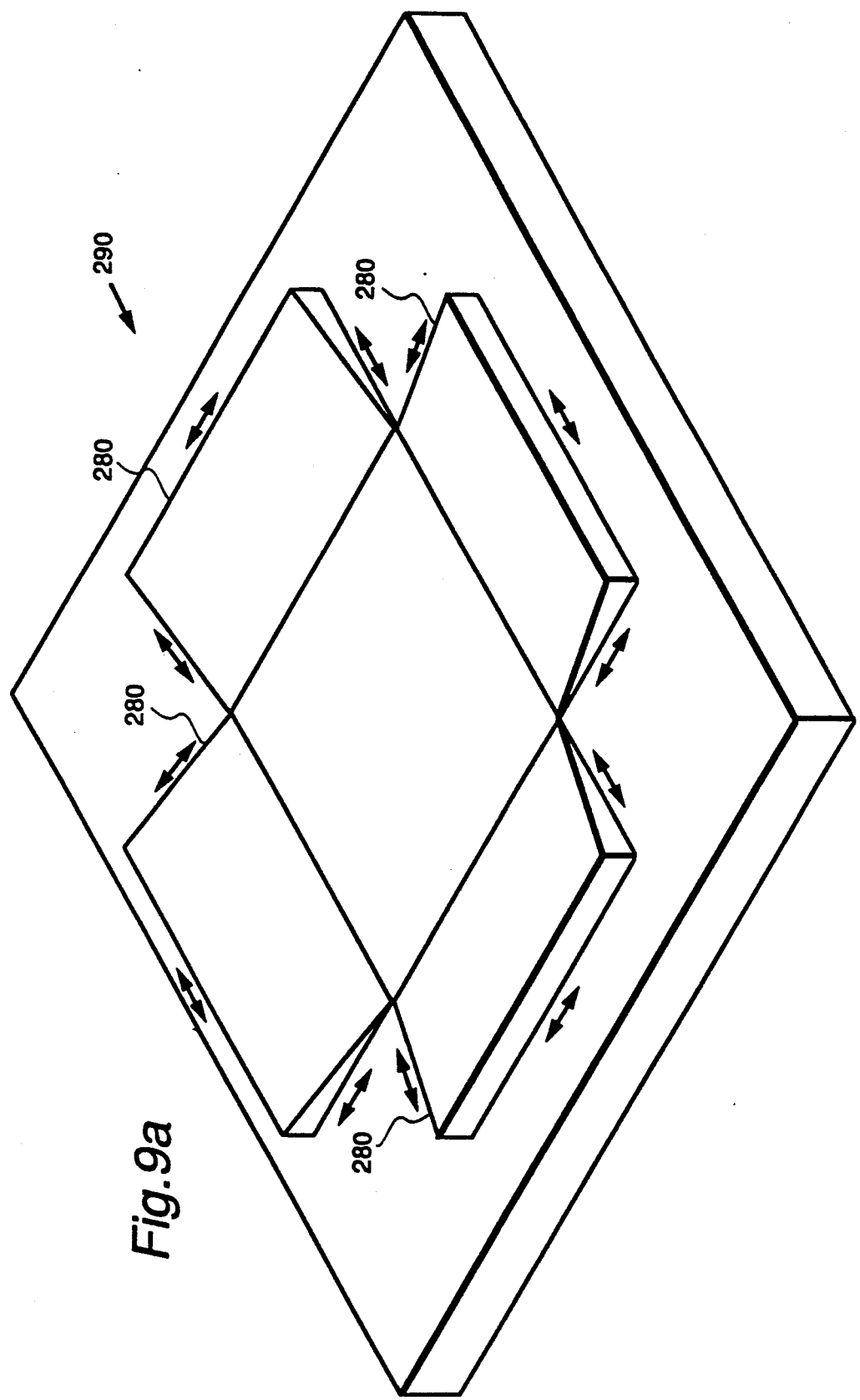

METHOD AND APPARATUS FOR FABRICATING A METAL INTERCONNECTION PATTERN FOR AN INTEGRATED CIRCUIT MODULE

The invention was made with Government support under contract No. F29601-89-C-0014 awarded by the United States Air Force. The Government has certain rights in the invention.

RELATED APPLICATIONS

This application is related to patent application Ser. No. 07/959,866 (RD-21,460) entitled "Edge Metallized High Density Interconnect Substrates to Enable Fabrication and Interconnection of Three-Dimensional Modules" by Gorczyca et al., filed Oct. 13, 1992, assigned to the assignee of the present invention and herein incorporated by reference.

FIELD OF THE INVENTION

This invention is generally directed to a method for fabricating a metal interconnection pattern for an integrated circuit module incorporating one or more integrated circuits and, more particularly, relates to fabricating a metal interconnection pattern for faces of such a module other than the top face.

BACKGROUND OF THE INVENTION

Integrated circuit modules of the type mentioned above, such as multichip modules (MCMS), are shown and described in U.S. Pat. No. 4,783,695, "Multichip Integrated Circuit Packaging Configuration and Method," issued Nov. 8, 1988, and in U.S. Pat. No. 4,918,811, "Multichip Integrated Circuit Packaging Method," issued Apr. 24, 1990, both assigned to the assignee of the present invention and herein incorporated by reference. Such so-called high density interconnect (HDI) structures, which may be built up in an integrated circuit module by means of multiple layer sequences stacked over the electrical or electronic circuit component or components and the substrate, provide the capability to interconnect the components, such as VLSI chips, to achieve improved integration. In such a module, each sequence includes at least a dielectric film, such as a polymer, and a metal layer that overlies the film and that makes the desired intrachip and interchip connections. Typically, the top face of the module is aligned with respect to the patterning system during the fabrication of the metallized interconnect, such as by positioning at least two reference points on the face of the module, to permit positioning of the desired interconnection pattern to be fabricated on the top or aligned face and thereby ensure that the desired electrical connections are achieved. One possible alignment technique is described in U.S. Pat. No. 4,835,704, "Adaptive Lithography System to Provide High Density Interconnect," issued May 30, 1989, assigned to the assignee of the present invention and herein incorporated by reference.

Various methods of fabrication have been devised to produce such modules, as disclosed in the aforementioned patents. Likewise, structures for interconnecting modules have been devised to achieve more interconnections and higher integration than previously available, such as disclosed in U.S. Pat. No. 5,019,946, "High Density Interconnect with High Volumetric Efficiency," issued May 28, 1991, assigned to the assignee of the present invention and herein incorporated by reference. As disclosed in the last recited patent, interconnected integrated circuits packaged at a high density are fabricated with a plurality of substrates where each substrate has metal edge contact sites and the substrates are joined together in a stack held together tightly, such as by bolts or by a thermoplastic adhesive. In such a stack, a metal interconnection pattern electrically connects or couples the integrated circuits on different substrates. Thus, in the fabrication of these modules it is desirable to shape a metal interconnection pattern on a face of the module other than the top or aligned face.

SUMMARY OF THE INVENTION

One object of the invention is to provide a method for fabricating a metal interconnection pattern in which the patterning of photoresist for a face of the module other than the aligned face takes place substantially in situ.

Another object of the invention is to provide a method for fabricating a metal interconnection pattern in which photoresist coating a metal layer on more than one face of a module is exposed, such as with radiation, while maintaining registration or alignment of only one face.

Yet another object of the invention is to provide a method for fabricating a metal interconnection pattern employing either electrophoretic or electrostatic deposition of photoresist.

Briefly, in accordance with one embodiment of the invention, a method for fabricating a metal interconnection pattern for an integrated circuit module comprises the steps of: aligning one face of the module, such as by positioning reference points on that face, forming a metal layer on at least one other face of the module, applying a coating of photoresist to the metal layer, exposing predetermined portions of the photoresist, and shaping the metal layer in accordance with the exposed portions.

BRIEF DESCRIPTION OF THE DRAWINGS

The subject matter regarded as the invention is particularly pointed out and distinctly claimed in the concluding portion of the specification. The invention, however, both as to organization and method of fabrication, together with further objects and advantages thereof, may best be understood by reference to the following detailed description when read with the accompanying drawings in which:

FIGS. 9a and 9b, respectively, are plan views of an embodiment of a metal interconnect patterning apparatus in accordance with the invention.

DETAILED DESCRIPTION OF THE INVENTION

Figure 6:
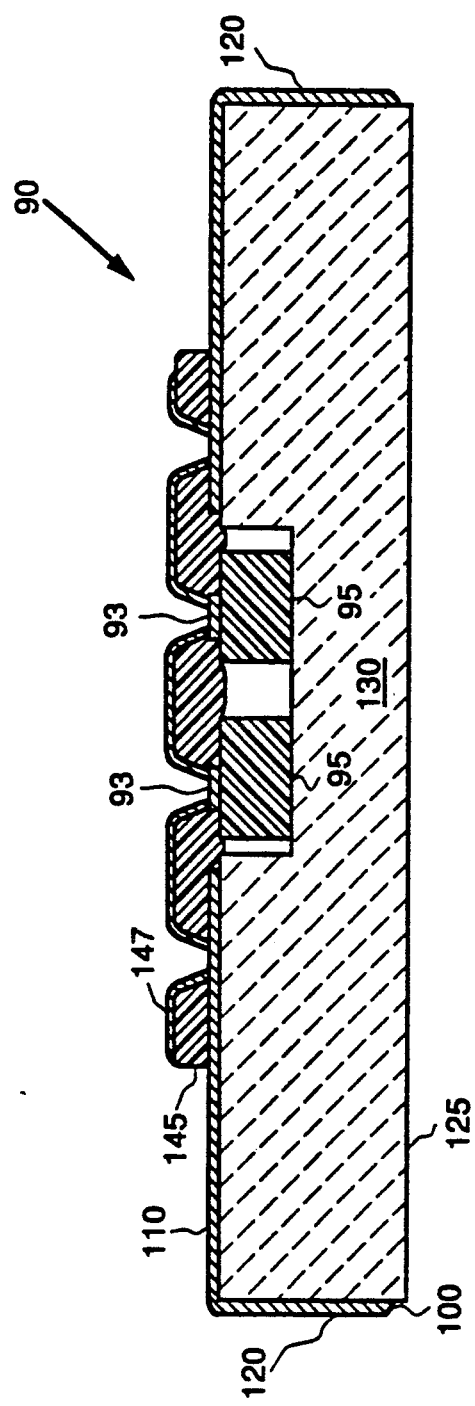
FIG. 6 is a schematic sectional side view illustrating an integrated circuit module having a metal interconnection pattern fabricated in accordance with the invention.

FIG. 6 illustrates an integrated circuit module 90, such as a multichip module, having a metal interconnection pattern 100 fabricated in accordance with the invention. In the context of this invention, an integrated circuit module may incorporate one or more electrical or electronic components, such as a single integrated circuit, a plurality of integrated circuit chips 95, or electrical components other than integrated circuit chips, such as resistors or capacitors. The module includes a top face 110, a bottom face 125, four side faces 120, and a substrate 130.

In fabricating metal interconnection pattern 100 in accordance with the invention, a face of module 90, such as top face 110, is first aligned. In the context of the present invention, alignment or registration of a face of a module with respect to a patterning system, such as with a laser lithography system, refers to positioning at least two reference points on the particular face. One technique for such alignment or registration comprises selecting features on a module face as reference points and determining or measuring the actual positions of these features relative to predetermined or preselected positions, such as chosen through a viewing system. Alternatively, the module face may be aligned by moving the face so that the actual positions of the features substantially coincide with the preselected positions. Likewise, instead of selecting features, reference points, such as fiducial marks, may be placed on the face and the actual positions of the marks on the module face may be determined or measured relative to preselected positions. For the type of lithographic processing described hereinafter, such alignment provides the capability to position a photomask or a beam of radiation, such as produced by a laser, relative to the reference points on the top or aligned face and, thus, expose the module to radiation so as to fabricate the desired metal interconnection pattern relative to the actual positions of the electrical or electronic circuit components. Chapter 4 of *Microlithography: Process Technology for IC Fabrication*, titled "Imaging," written by David Elliot, published by McGraw-Hill Book Company (1986) and Chapter 9 of *Microchip Fabrication*, titled "Introduction to Photomasking," written by Peter Van Zant, published by Semiconductor Services (1985), both of which are herein incorporated by reference, describe various techniques for alignment typically employed in photolithography. Furthermore, an adaptive alignment technique is described in aforesaid U.S. Pat. No. 4,835,704. As described in that patent, a direct write laser lithography system may determine the position and orientation of a plurality of integrated circuit chips on a substrate. According to the patent, this process may be performed automatically using a charge-injection device (CID) camera and an image recognition technique to align the top face of each electrical component and calculate offset and rotation information. Alternatively, as described, the substrate may be aligned on an x-y table in both location and rotation according to fiducial marks on the substrate. Then a computer may record the difference between the preselected or ideal position and the actual position of each integrated circuit chip.

Next, a metal layer may be formed on the aligned face and at least one other face, such as one of side faces 120 of module 90. An alternative embodiment may comprise forming a metal layer on at least one other face of the module, such as a face having a common edge with the aligned face, without forming such as a layer on the aligned face. Furthermore, for the fabrication of other metal layers of the module, such as layer 147 in FIG. 6, other materials may be interposed between the substrate and metal layer 147, such as a polymer film 145 or electrical components 95. As illustrated, the components may include metal interconnection pads 93.

A coating of photoresist is next applied to the metal layer. As shown schematically in FIGS. 1 and 2, portions of the applied photoresist coating 140 on top face 110 and at least one side face 120 are then exposed to radiation so as to pattern the photoresist. In the context of the invention exposing the photoresist comprises exposing it to a sufficient amount of radiation to render it developable, as described hereinafter. Otherwise, the photoresist is substantially unexposed. As will be appreciated by one skilled in the art, exposing portions of the photoresist, such as with a laser beam, effects a chemical change in the photoresist that renders it capable of being developed by further chemical processing. For example, exposure may render the exposed portions of the photoresist insoluble or unreactive to particular developers, such as selected solvents, while leaving the unexposed portions soluble. Likewise, depending on the photoresist, exposure may render the exposed portions soluble to selected developers while leaving the unexposed portions insoluble. Thus, at this point, depending upon whether the photoresist is a "positive" or a "negative" photoresist, one of two fabrication approaches may be employed. If photoresist 140 is a positive photoresist, its irradiated or exposed portions are removed to reveal underlying sections of the metal layer, such as layer 100' in FIG. 2, and the bared or revealed metal sections are etched to form a metal interconnection pattern. Alternatively, where photoresist 140 is a negative photoresist, its unexposed portions of the photoresist are removed to reveal underlying sections of metal layer 100' and the bared or revealed metal sections are etched to form the metal interconnection pattern.

Metal layer 100' may be formed by any one of a number of methods, such as disclosed in aforesaid U.S. Pat. Nos. 4,783,695, and 4,918,811. For example, successive sublayers of titanium, copper, and titanium may be built up by conventional sputtering techniques on a substrate or polymer film. Alternatively, a copper sublayer may be formed on a first deposited titanium sublayer by sputtering a thin sublayer and then building up the copper thickness by a standard electroplating technique. Thereafter, the second sublayer of titanium may be sputtered on the aforesaid copper sublayer. The three sublayers so deposited may jointly form the metal layer. It will be appreciated that other metals may prove satisfactory for the metal layer or for one of the sublayers, such as gold or chromium.

Figure 2:
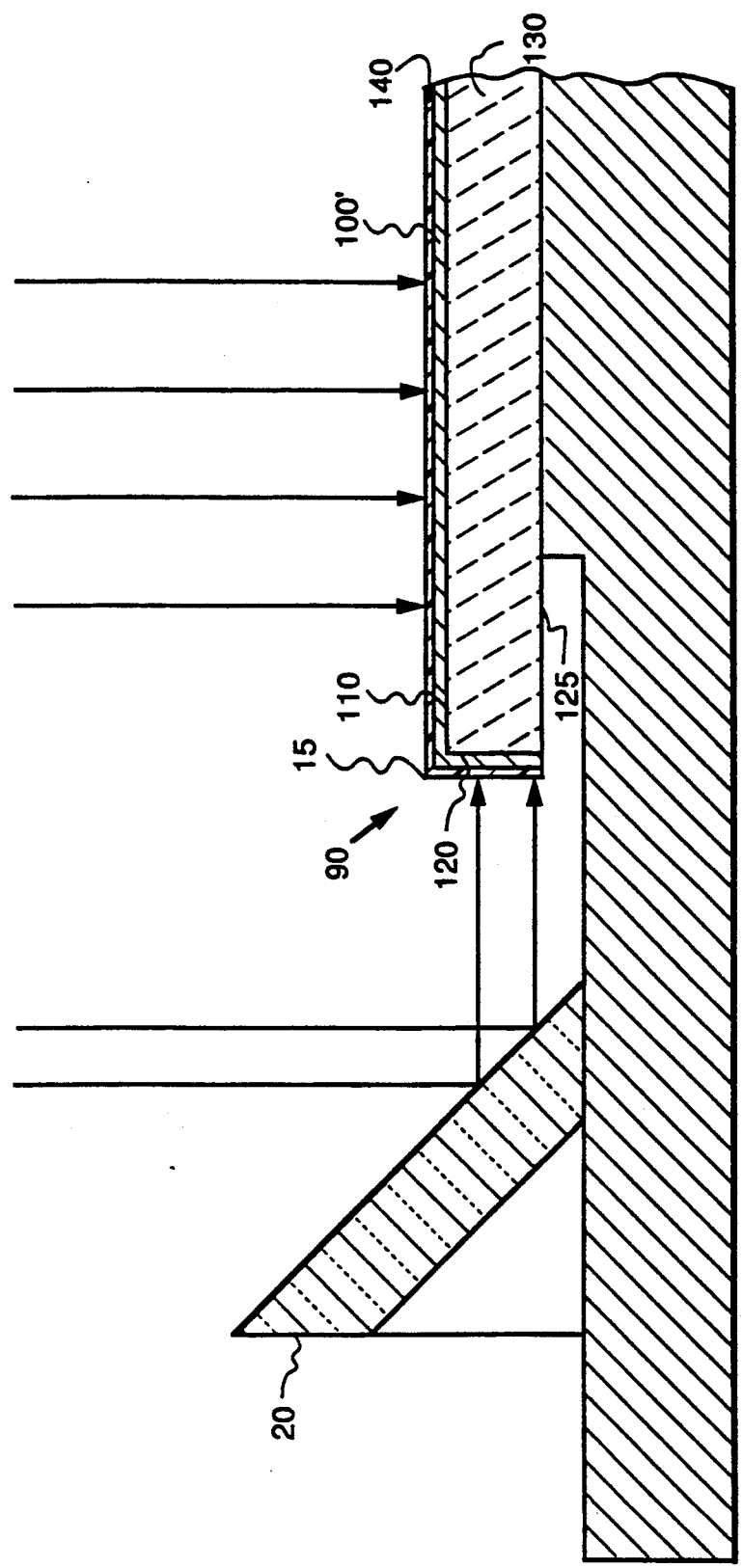
FIG. 2 illustrates a portion of FIG. 1 in greater detail.

Next, as previously described, a conventional photoresist is applied as a coating, such as coating 140 in FIG. 2. Coating 140 should be applied to metal layer 100' uniformly, including edges 15 of the metallized substrate, such as where top face 110 meets side faces 120, and, likewise, where side faces 120 meet bottom face 125. Conventional coating techniques may not produce the desired uniform coating in part due to the surface tension of the photoresist when it is applied to edges, such as those on a rectangular module. Moreover, the photoresist coating has excessive thickness on the top face and insufficient thickness on the side face and edges for satisfactory fabrication of a metal interconnection pattern. Thus, one technique for applying such a uniform coating of photoresist comprises electrodeposition by electrophoresis or electrophoretic deposition, as described in the article "Electrodeposition of Primary Photoresists," published in *Electronic Packaging & Production*, February, 1992, pp. 66–68, and herein incorporated by reference. Electrophoretic deposition may be performed using the Eagle Photoresist System, as described in the "Eagle® 2100ED Electrodeposition Photoresist System Process Manual," available from Shipley Company, Inc. and herein incorporated by reference According to the aforesaid article, similar systems for performing electrophoretic deposition are also available from other companies, such as E. I. duPont deNemours & Co., MacDermid, and Nippon Paint.

An alternative technique for applying a uniform coating of photoresist comprises electrostatic deposition or applying a coating by electrostatic spray, as described in Chapter 10 of *The Technology of Powder Coatings*, written by S. T. Harris, published by Portcullis Press, Ltd (1976), and likewise herein incorporated by reference.

As previously discussed, photoresist coating 140 may comprise either a negative photoresist or a positive photoresist. Where photoresist 140 is a positive photoresist, such as Sonne EDUV available from Kansai Paint, Photo EDP-1000 available from Nippon Paint, or XP-91227 available from Shipley, the exposed portions of the photoresist are removed to reveal sections of metal layer 100', such as by spraying module 90 with a solvent to dissolve the exposed resist. Alternatively, where photoresist 140 is a negative photoresist, such as XP-5501-4 Resist available from Shipley, module 90 is sprayed with a solvent, such as Lactic Acid Developer, to remove the unexposed portions of the photoresist. Likewise, the module may be immersed in developer rather than sprayed.

Figure 1:
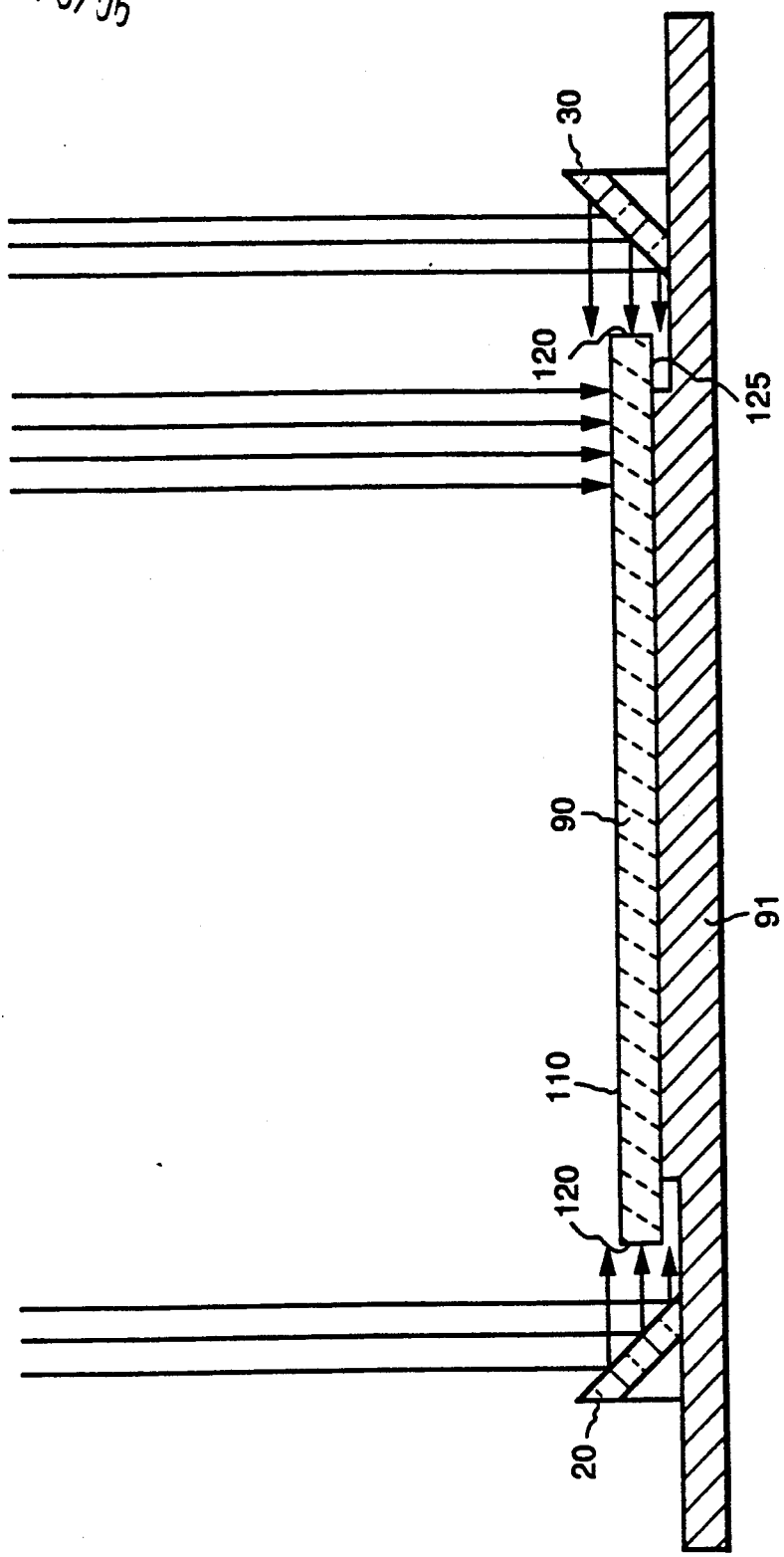
FIG. 1 is a schematic diagram illustrating a step in one embodiment of a method for fabricating a metal interconnection pattern in accordance with the invention.

As illustrated in FIG. 1, during exposure of portions of the photoresist, module 90 is positioned or mounted on a base, such as a vacuum chuck 91, to keep it substantially stationary during processing. When placed in the apparatus illustrated, the side faces of the module extend beyond the edges of the base supporting the module so as to permit full exposure of the four side faces 120 and portions of bottom face 125. FIG. 1 further shows a pair of mirrors 20 and 30 positioned adjacent the opposing side faces of module 90 to reflect light from a substantially vertical path to a substantially horizontal path so that the reflected light exposes portions of the photoresist on the two opposing side faces, as illustrated for the side face in greater detail in FIG. 2. Although not shown in FIGS. 1 and 2, the mirrors may directly contact the module to position them with respect to the particular face to be exposed. In the embodiment illustrated in FIGS. 1 and 2, mirrors 20 and 30 are oriented at approximately a 45° angle relative to the incident light. Nonetheless, as described further hereinafter, the invention is not restricted in scope to this particular angle of reflection.

In the embodiment illustrated in FIGS. 1 and 2, the photoresist coating the metal layer on different module faces may be exposed substantially simultaneously or in one or more passes of a light source, such as during a raster or vector scan with a laser beam. In FIG. 1, radiation, such as light, is emitted from a source (not shown) above the top face of the module. In this particular embodiment, the light travels in a substantially vertical path towards module 90 with a portion of the emitted light exposing predetermined sections or portions of the photoresist coating the part or section of the metal layer on top face 110. Likewise, in this embodiment, other portions of the emitted light travel in a substantially vertical path towards the respective mirrors 20 and 30. As will now be appreciated, the light must be directed to propagate to predetermined areas extending beyond the top face of the module to fabricate a metal interconnection pattern in accordance with the invention. Each mirror thus reflects portions of the emitted light at approximately a 45° angle relative to the vertical path of the light so that the light travels in a substantially horizontal path, after reflection, towards the side face immediately opposing that mirror. The photoresist coating the section of the metal layer on the side faces may be exposed at substantially the same time as the photoresist coating the section on the top face where a source or sources emit the light substantially simultaneously. In such an embodiment, a photomask may be employed to expose the photoresist by blocking some of the radiation.

After exposure and removal of portions of the photoresist, as previously described, predetermined sections or portions of metal layer 100' are etched by conventional techniques to form the desired metal interconnection pattern. The composition of the metal layer may affect the particular etching technique employed. For example, where the metal layer is formed by sputtering successive sublayers, each sublayer may be etched by spraying with a chemically compatible etchant. For a titanium-copper-titanium metal layer, for example, a dilute hydrogen floride solution, a dilute ferric chloride solution, and then another spraying of the hydrogen floride solution are successively employed to etch the respective sublayers. In situations where metal layer 100' is formed by sputtering a titanium sublayer and then a thin sublayer of copper, the sputtered copper sublayer may be coated with a positive or negative photoresist, exposed and patterned or developed to form a desired pattern before electroplating additional copper, or other electroplatable metals such as chromium, onto the sublayer. The thin copper and titanium sublayers may then be etched after electroplating and removing the portions of the photoresist coating the metal sections to be etched. Likewise, metal sublayers may be built-up by electroless plating rather than by electroplating for protection from oxidation.

In one embodiment of the invention, movement of a source, such as a laser, may direct the light to different predetermined portions or sections of the top and side faces of module 90, such as by a "direct write" laser lithography system. Thus, the laser source may make a single pass or, alternatively, a plurality of passes, such as a raster or vector scan, to expose portions of the photoresist coating the part of metal layer 100' on top face 110 and side faces 120 without moving the module and without reregistering or realigning the top face of substrate 130. The fabrication of such a metal interconnection pattern in accordance with the invention reduces the alignment or registration errors typically resulting from a lack of reference points for the faces of the substrate other than the aligned face. This ability to expose photoresist coating the metal layer on the aligned face and faces other than the aligned face of a module so as to provide a developable photoresist pattern without the need for moving or realigning the module provides a substantial improvement in the available methods or techniques for fabricating multichip modules. As disclosed in aforesaid U.S. Pat. No. 4,835,704, registration or alignment of integrated circuits on a module is a problem typically encountered in the fabrication of such multichip modules. Likewise, this advance in the technology provides improved productivity because the fabrication will typically take place in less time, typically requires less module handling, and, thus, is likely to result in less damage during processing.

The method of fabricating a metal interconnection pattern in accordance with the invention has a further advantage in that it is adaptable to substrates of different sizes, as will typically be produced during manufacturing. As disclosed in aforesaid U.S. Pat. No. 4,835,704, a lithography system may adaptively determine reference points on the aligned face of a substrate over which a metal interconnection pattern is to be fabricated. This reference point placement results in registration or alignment of the module. Likewise, once this registration or alignment is accomplished to facilitate the fabrication of a metal interconnection pattern on a non-aligned face such as a side face or even the bottom face of the module, the substrate may be diced, such as by a diamond saw, a laser saw, or, alternatively, by grinding. Various apparatuses for performing such dicing are commercially available, such as an Esec Model 8003 High Performance Dicing Saw or a Micro Automation Dicing Saw Model 1006.

Although the invention is not restricted in scope to laser light or to ultraviolet light, one aspect of fabricating a metal interconnection in accordance with the invention is achieving a sufficient depth of focus during exposure of the photoresist. Thus, for the embodiment illustrated in FIG. 1 laser light is typically employed having a wavelength in the range from approximately 300 nanometers to approximately 450 nanometers. This permits a sufficient laser-illuminated "spot," such as a spot size of approximately 9 microns, to allow fabrication of a metal interconnection pattern within the desired precision tolerance for the metallized pattern. The depth of focus impacts the exposure of the photoresist because the reflection of light typically increases the distance a light ray must travel before interacting with the photoresist. Thus, to alleviate this problem, depending upon the particular interconnection pattern being fabricated, the metallization or interconnect pattern for the nonaligned faces of the module may be restricted to larger features relative to the metallization pattern for the top face. Alternatively, the focus setting may be adjusted for patterning the photoresist coating the metal on the nonaligned faces.

Figure 3:
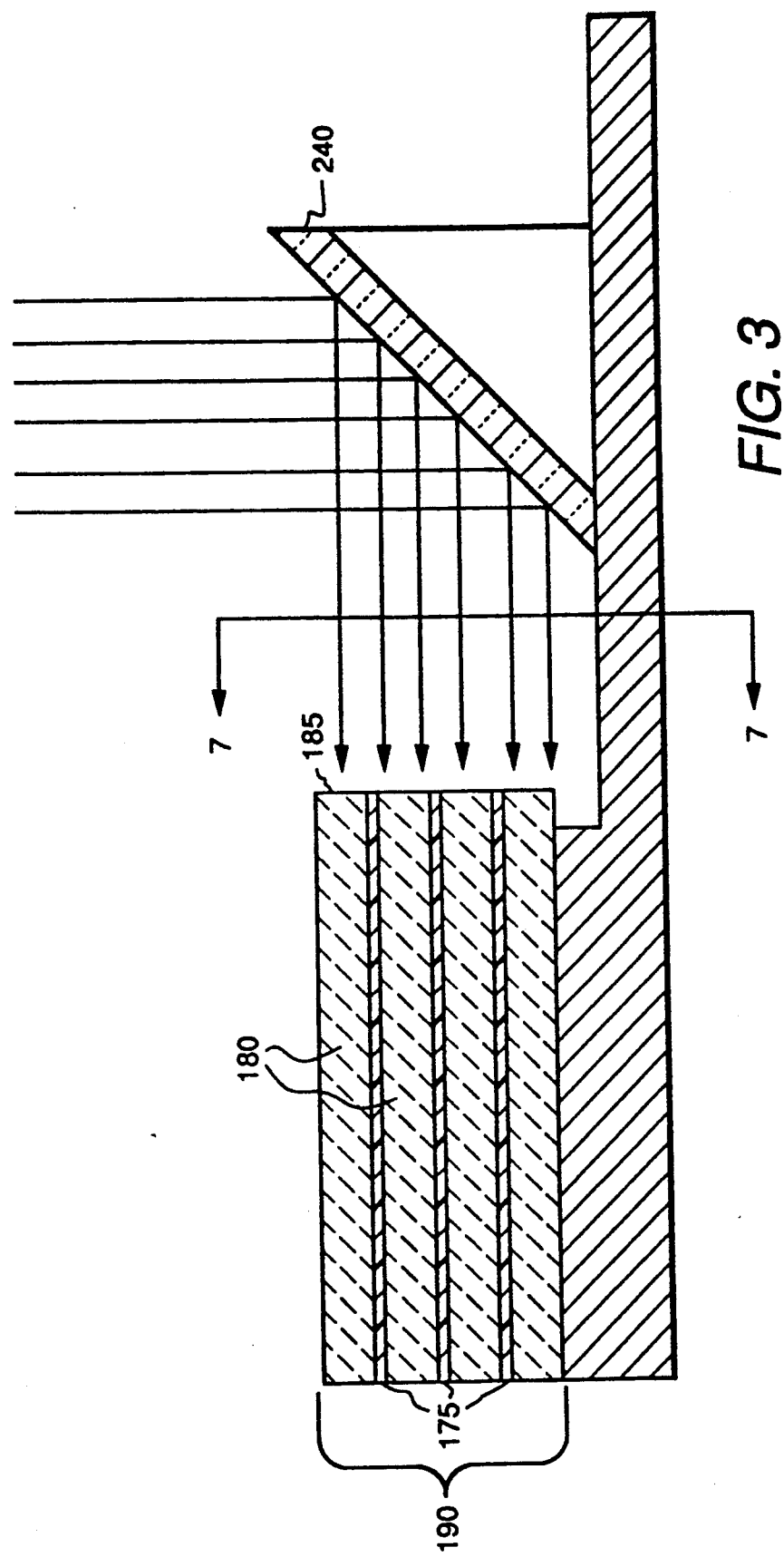
FIG. 3 illustrates a step in an alternative embodiment of a method for fabricating a metal interconnection pattern in accordance with the invention.

FIG. 3 illustrates a step in another embodiment of a method for fabricating a metal interconnection pattern in accordance with the invention. A plurality of modules 180 are joined together in a stack 190, such as by a thermoplastic adhesive as disclosed in aforesaid U.S. Pat. No. 5,019,946. Thus, a metal interconnection pattern for a side face 185 of stack 190 is fabricated by exposing a coating of photoresist (not shown) for side face 185, the stack side face being immediately opposite mirror 240 and comprised of the side faces of a plurality of adjacent modules. For satisfactory fabrication of a metal pattern interconnecting the side faces of the modules, the module side faces should be substantially coplanar. This may be accomplished by dicing, diamond sawing, laser sawing, or grinding the stack of modules, as previously described for a single substrate.

Figure 7:
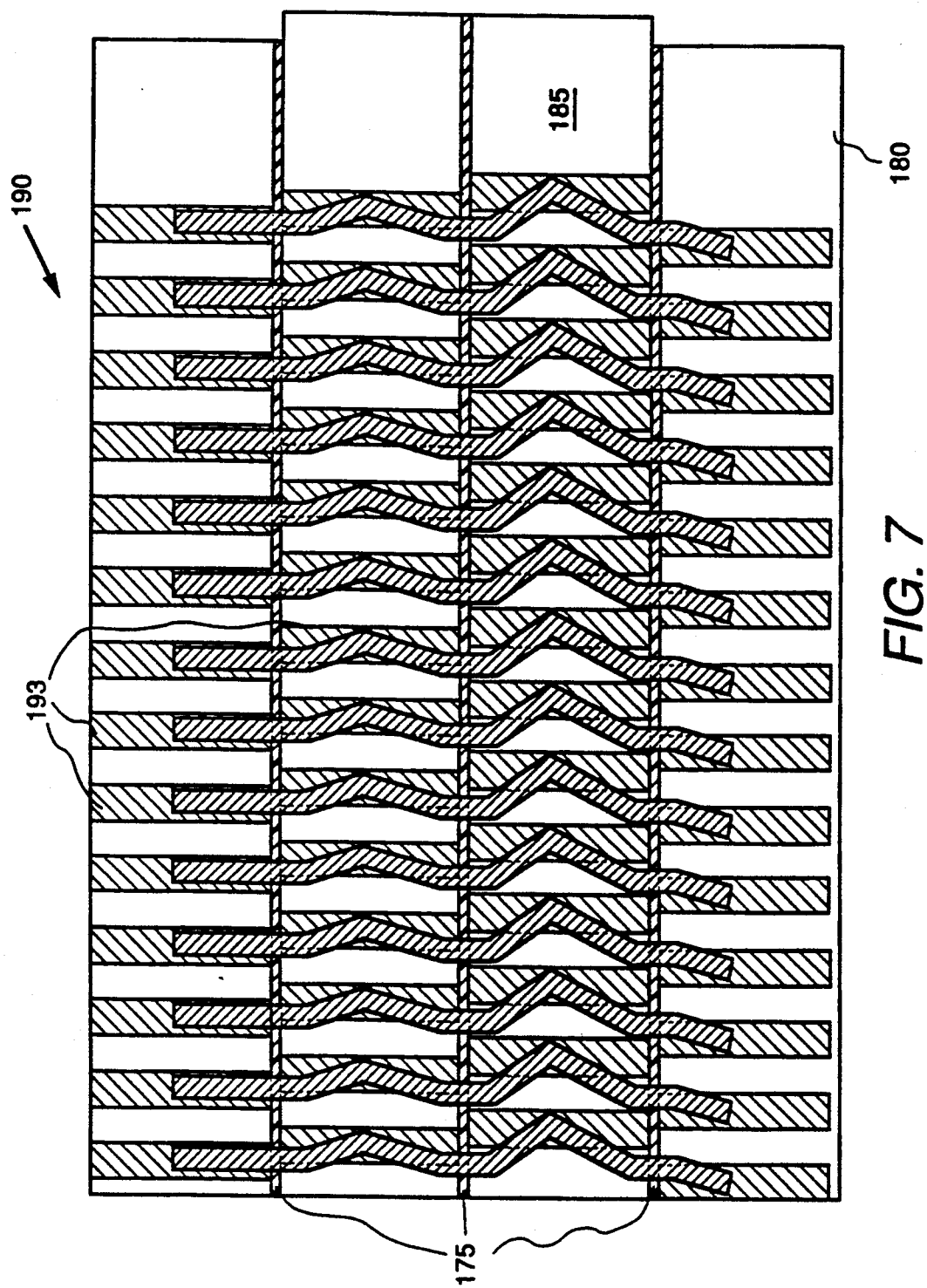
FIG. 7 is a cross-sectional view of the stack illustrated in FIG. 3 taken along line 7—7 after fabrication of a metal interconnection pattern: in accordance with the invention.

FIG. 7 illustrates a cross-sectional view of stack 190 illustrated in FIG. 3, taken along line 7—7 after fabrication of a metal interconnection pattern on side face 185 interconnecting vertical metallization lines or "fingers" of the modules. As illustrated, the substantially co-planar side faces of the modules each have vertical metallization lines or "fingers" 193 forming a metal interconnection pattern for the particular module. These module interconnection patterns may have been fabricated in accordance with the present invention. Likewise, the metal interconnection pattern for the stack directly contacts and thus interconnects the separate module interconnection patterns.

Figure 4:
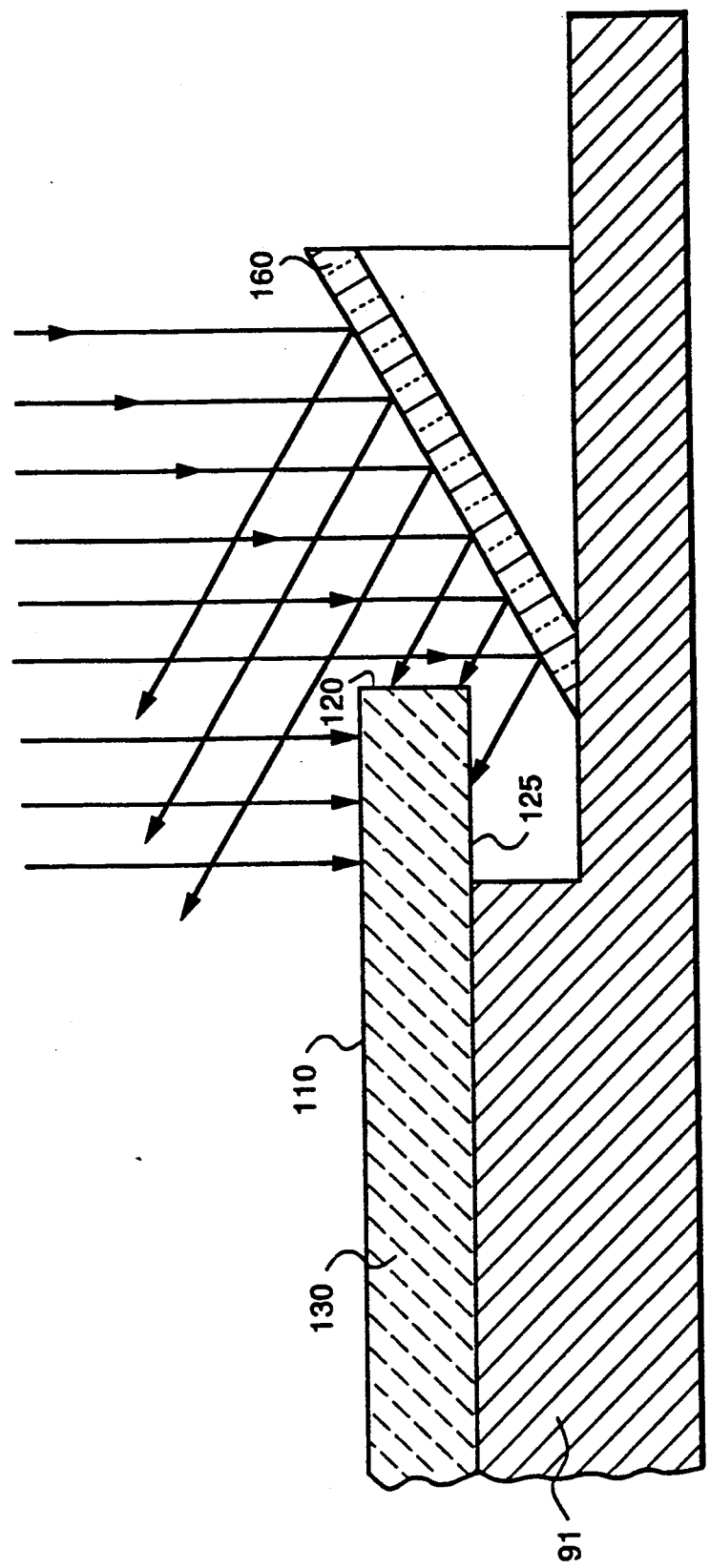
FIG. 4 illustrates a step in another alternative embodiment of a method for fabricating a metal interconnection pattern in accordance with the invention.
Figure 5A:
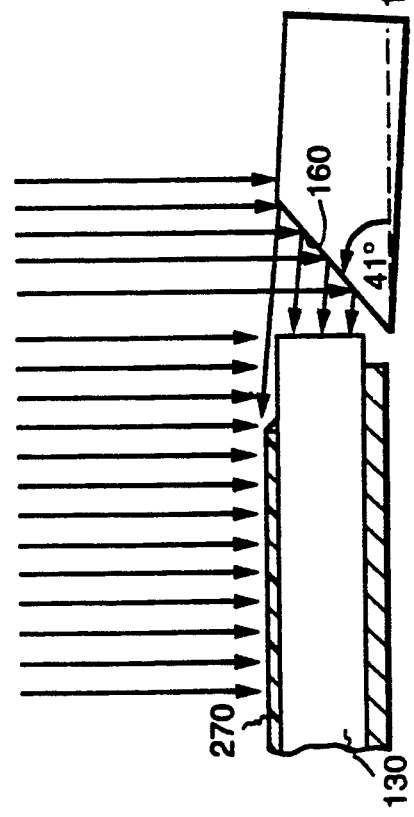
FIGS. 5a to 5d each illustrate a step in yet other alternative embodiments of a method for fabricating a metal interconnection pattern in accordance with the invention.
Figure 5B:
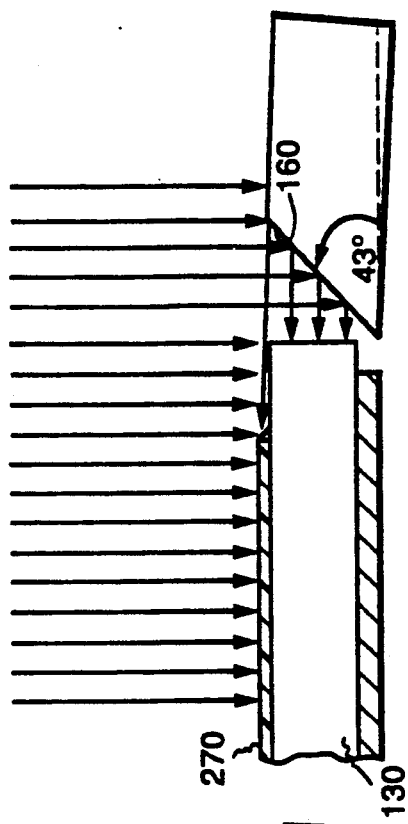
Figure 5C:
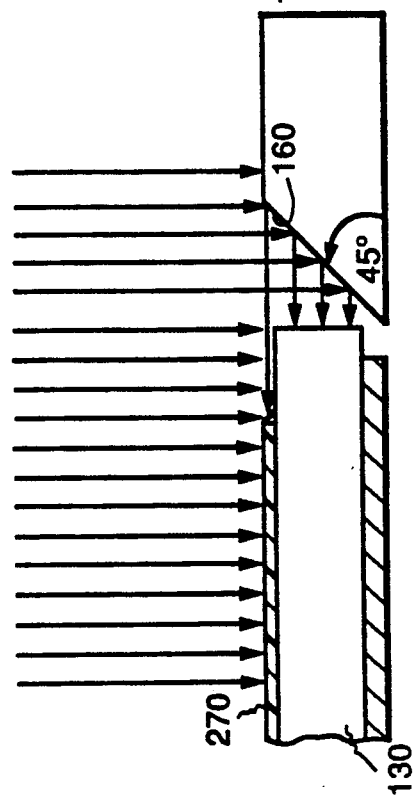
Figure 5D:
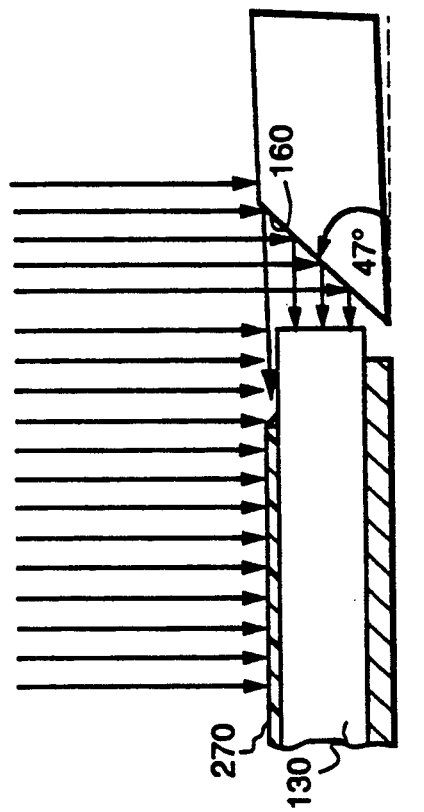

FIG. 4 illustrates a step in another alternative embodiment of the invention in which predetermined portions of a photoresist coating the metal layer on the section of bottom face 125 adjacent the bottom face edges are exposed so as to provide a developable pattern of resist. As illustrated in FIG. 4, this "backside" exposure in which a face directly opposing the aligned face is exposed may be accomplished by a mirror 160 oriented at approximately a 60° angle with respect to the vertical path of the emitted light or oriented at approximately a 30° angle with respect to the non-aligned face. As illustrated, mirror 160 reflects the emitted light so that it is incident upon, and thus exposes, predetermined portions of the photoresist coating the metal layer on the bottom face of the module. In this particular embodiment, the metal interconnection pattern fabricated may "wrap around" from one of the side faces to the bottom face. A negative photoresist may typically be employed to reduce exposure time because the metal layer and the photoresist coating may coat the entire bottom face of the module whereas the interconnect pattern may only occupy a portion thereof.

A number of advantages are obtained by fabricating a metal interconnection pattern for the bottom face of the module. For example, this permits the interconnection of adjacent modules in a stack where the immediately underlying module has a metal interconnection pattern on its top face. Likewise, this permits testing of an HDI structure fabricated on the substrate without damaging the metal interconnection pattern formed on the top or side faces of the module, particularly where such side face interconnection patterns may be necessary to interconnect stacks positioned adjacent one another. Such fabrication also eliminates the need to uncover metallization, such as by ablation of an overlying polymer film or other material, as may typically occur in module or stack assembly or testing.

FIGS. 5a to 5d show a step of other alternative embodiments of a method of fabricating metal interconnection pattern in accordance with the invention in which mirror 160 is oriented at an angles 41°, 43°, 45°, and 47°, respectively, relative to a substantially horizontal direction. Although any of the angles of reflection in the range from approximately 25° to approximately 65°, such as those illustrated, would prove satisfactory, the angle illustrated in FIG. 5a has the advantage that at that particular angle and at smaller angles the common edge of the top face and the side face opposing the mirror acts as a "mask" for the reflected light to avoid exposing photoresist on the top face of the module with the reflected rays, such as photoresist coating 270.

Figure 9B:
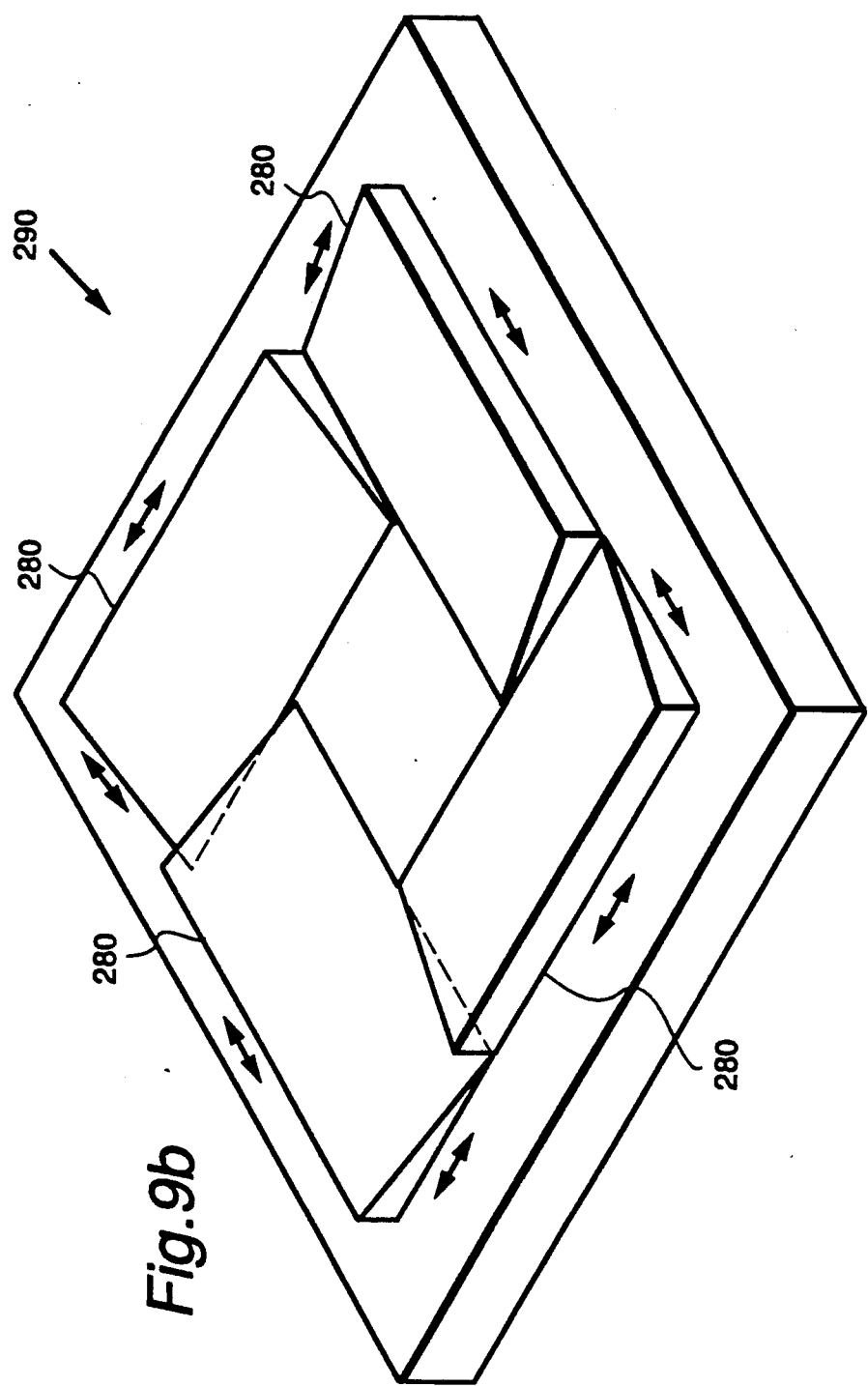

The invention is not restricted in scope to only two mirrors, each to expose an opposing side face of a module, as illustrated in FIG. 1. For example, a mirror, or alternatively an array of mirrors, may be positioned adjacent each of the four side faces 120 of module 90 or, alternatively, of a stack of modules, so as to reflect light in the direction of the side face immediately opposite the mirror or mirrors. FIGS. 9a and 9b illustrate an embodiment of such an apparatus 290 for fabricating a metal interconnection pattern in accordance with the invention. In this embodiment, slideably moveable mirrors 280 are positioned relative to each other to accommodate a rectangular module, such as a module in which the length of the longest side face of the module along a direction substantially parallel with the side face does not exceed the length of a mirror.

Figure 8:
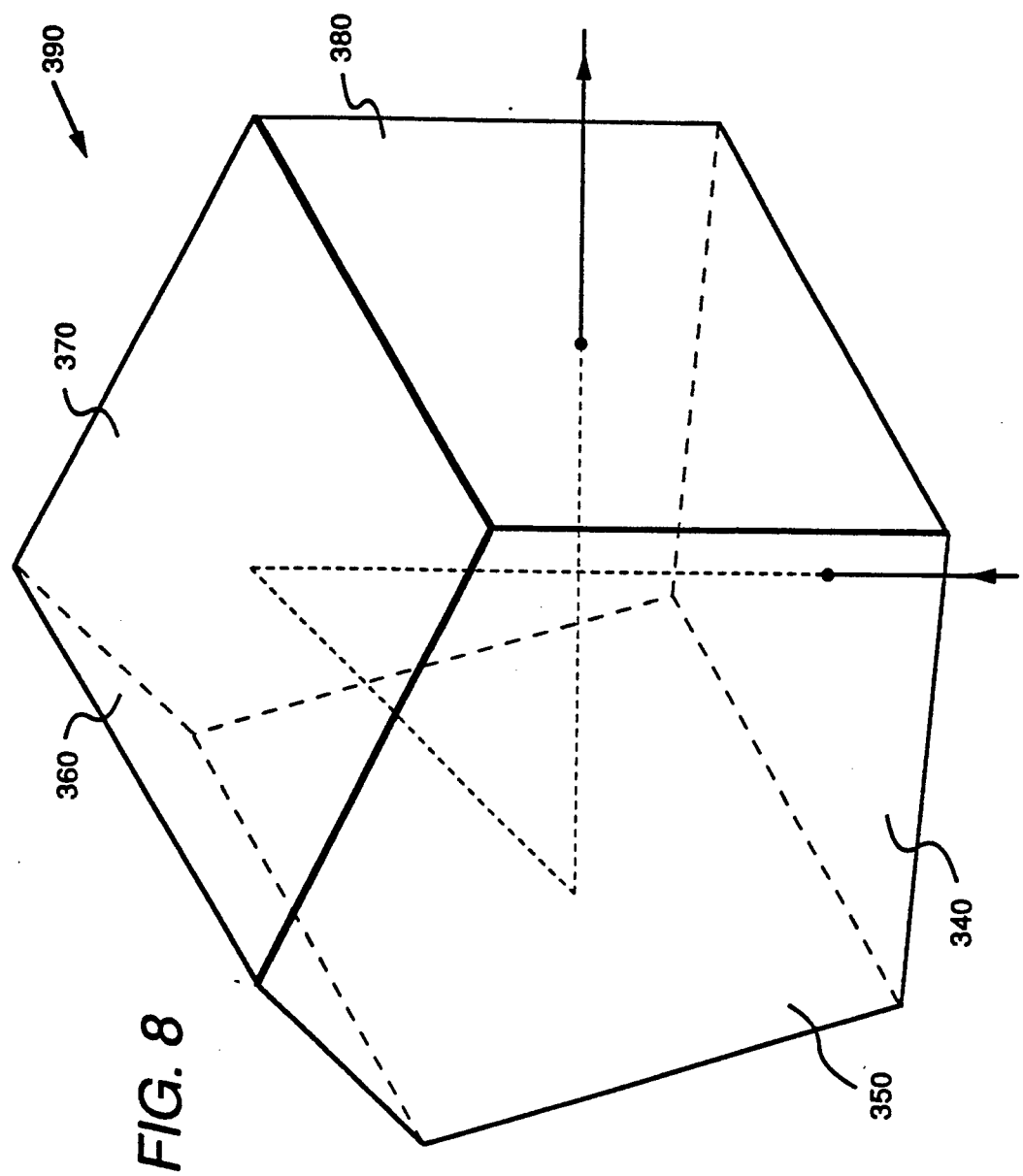
FIG. 8 is a schematic diagram of a quartz penta prism for use in the fabrication of a metal interconnection in accordance with the invention.

The embodiment illustrated in FIG. 1 results in the fabrication of a metal interconnection pattern in which the pattern fabricated relative to the pattern produced by a source of radiation may be inverted on a non-aligned face, such as a side face of the module. This occurs from the use of a substantially planar or flat mirror. Fabrication may adjust for this pattern inversion by reverse or mirror imaging to provide the desired interconnection pattern, although typically vertical metallization lines are patterned that are symmetrical about a horizontal plane oriented substantially parallel with the top face. It will now be appreciated that an alternative embodiment may include exposing a mirror image of the desired pattern for the side faces and exposing the bottom face using a separate pattern. However, in another alternative embodiment, the side faces of the module may be exposed using a quartz penta prism which deviates the optical axis through 90° without inverting the image, such as prism 390 illustrated in FIG. 8 having faces 380, 370, 360, 350, and 340 for reflecting radiation, such as the light ray illustrated. It will be appreciated that face 340 may typically be positioned next to the radiation source whereas face 380 may typically be positioned next to the face of the module to be exposed. One type of penta prism is described in Optical Guide 4, page 9-9, available from Melles Griot, and herein incorporated by reference. An embodiment incorporating such a prism would permit exposing the photoresist to pattern it without mirror imaging of the desired interconnection pattern.

While only certain features of the invention have been illustrated and described herein, many modifications, substitutions, changes, and equivalents will now occur to those skilled in the art. For example, stacked arrays of multichip integrated circuit modules for building complex high performance circuits in a small volume may be assembled by using electrical connections patterned as described herein. The sides of the stacked substrates may then be laminated or otherwise coated with a dielectric film, such as a polymer, and interconnect structures may be built using the HDI technology, such as described in aforementioned U.S. Pat. Nos. 4,783,695, 4,918,811, and 5,019,946. Alternatively, wire bonds or other connection techniques may be used directly on the patterned metallization for the side or bottom face. In addition, testing fixtures may be fabricated to contact the side or the bottom face metallization without removing layers or dielectric films more remote from the substrate. Soldered, wire bonded, or other electrical connections may be made to the side or bottom face metallization to permit packaging. It is, therefore, to be understood that the appended claims are intended to cover all such modifications and changes as fall within the true spirit of the invention.

What is claimed is:

1. A method for fabricating a metal interconnection pattern for an integrated circuit module, said module including a top face, a bottom face and four side faces, said method comprising the steps of:
   aligning only one face of said module;
   forming a metal layer on at least one other face of said module;
   applying a coating of photoresist to said metal layer;
   exposing predetermined portions of the photoresist to reflected radiation; and
   shaping said metal layer in accordance with the exposed portions.

2. The method of claim 1, wherein the step of shaping said metal layer in accordance with the exposed portions comprises:
   removing the exposed portions of the photoresist to reveal sections of said metal layer; and
   etching the revealed sections of said metal layer to form said metal interconnection pattern.

3. The method of claim 1, wherein the step of shaping said metal layer in accordance with the exposed portions comprises:
   removing the unexposed portions of the photoresist to reveal sections of said metal layer; and
   etching the revealed sections of said metal layer to form said metal interconnection pattern.

4. The method of claim 1, wherein the coating of photoresist is applied substantially uniformly.

5. A method for fabricating a metal interconnection pattern for an integrated circuit module, said module including a top face, a bottom face and four side faces, said method comprising the steps of:
   aligning only one face of said module;
   forming a metal layer on at least the aligned face and a face of said module having a common edge with the aligned face;
   applying a substantially uniform coating of photoresist to said metal layer;
   exposing predetermined portions of the photoresist to radiation; and
   shaping said metal layer in accordance with the exposed portions.

6. The method of claim 5, wherein the predetermined portions of photoresist are exposed substantially simultaneously.

7. The method of claim 6, wherein the predetermined portions of photoresist are exposed using a photomask.

8. The method of claim 5, wherein the step of applying a coating of photoresist comprises electrophoretically depositing said photoresist.

9. The method of claim 5, wherein the step of applying a coating of photoresist comprises electrostatically depositing said photoresist.

10. The method of claim 5, wherein the step of exposing predetermined portions of photoresist comprises exposing to reflected radiation the predetermined portions coating the part of said metal layer on the face having a common edge with the aligned face.

11. The method of claim 5, wherein the aligned face is said top face, the face having a common edge with the aligned face being one of said side faces; and wherein the previously recited steps of forming a metal layer, applying a coating of photoresist, exposing predetermined portions of the photoresist to radiation, and shaping said metal layer in accordance with the exposed portions are also performed on the portion of the bottom face of said module adjacent the edge of said module common to the bottom face and the one side face.

12. The method of claim 10, wherein the radiation exposing the predetermined portions coating the part of said metal layer on the face having a common edge with the aligned face is reflected by a mirror oriented at a predetermined angle in the range from approximately 25 degrees to approximately 65 degrees relative to the aligned face.

13. The method of claim 12, wherein said predetermined angle is approximately 45 degrees.

14. The method of claim 12, wherein said predetermined angle is approximately 30 degrees.

15. The method of claim 10, wherein the radiation comprises light having a wavelength in the range from approximately 300 nanometers to approximately 450 nanometers.

16. The method of claim 12, wherein the predetermined portions of the photoresist are exposed to radiation by propagating laser light so that the light is incident upon the predetermined portions of the photoresist.

17. A metal interconnect patterning apparatus comprising:
a base adapted for mounting at least one integrated circuit module, said module including a top face, a bottom face and four side faces, so that one of the faces of said module is capable of being aligned; and
at least one device for reflecting light so that the reflected light is incident upon a face of said module other than the face to be aligned 18. The apparatus of claim 17, wherein said light reflecting device comprises a mirror.

19. The apparatus of claim 17, wherein said light reflecting device comprises a penta prism.

* * * * *